United States Patent
Haacke et al.

(10) Patent No.: US 6,560,353 B1
(45) Date of Patent: May 6, 2003

(54) METHOD OF MRI IMAGE RECONSTRUCTION FROM PARTIALLY ACQUIRED DATA IN TWO OR MORE DIMENSIONS USING A MULTIDIMENSIONAL INVERSE TRANSFORM TECHNIQUE

(75) Inventors: E. Mark Haacke, St. Louis, MO (US); Yingbiao Xu, St. Louis, MO (US)

(73) Assignee: Magnetic Resonance Innovations, Inc., St. Louis, MO (US)

( * ) Notice: Subject to any disclaimer, the term of this patent is extended or adjusted under 35 U.S.C. 154(b) by 0 days.

(21) Appl. No.: 09/532,508

(22) Filed: Mar. 21, 2000

(51) Int. Cl.⁷ .................................................. G06K 9/00
(52) U.S. Cl. ........................................ 382/128; 382/131
(58) Field of Search ................................ 382/128, 131, 382/154, 280, 282, 284; 378/4, 21, 22, 25; 600/407, 410, 425; 430/39

(56) References Cited

U.S. PATENT DOCUMENTS

| | | | | |
|---|---|---|---|---|
| 6,025,714 A | * | 2/2000 | Aavram et al. | 324/309 |
| 6,178,271 B1 | * | 1/2001 | Maas, III | 382/294 |
| 6,294,972 B1 | * | 9/2001 | Jesmanowicz et al. | 335/301 |
| 6,453,187 B1 | * | 9/2002 | Prince et al. | 600/410 |
| 6,469,505 B1 | * | 10/2002 | Maier et al. | 324/309 |
| 2001/0043068 A1 | * | 11/2001 | Lee | 324/309 |

OTHER PUBLICATIONS

P. Margosian, *Faster MR Imaging—Imaging with Half the Data,* Society of Magnetic Resonance in Medicine, Conference Abstracts of Fourth Annual Meeting, vol. 2, 1024–25 (1985).

D. A. Feinberg, J. D. Hale, J. C. Watts, L. Kaufman, A. Mark, *Halving MR Imaging Time by Conjugation: Demonstration at 3.5 kg,* Radiology, vol 161, 527–31 (1986).

J. Cuppen, A. van Est, *Reducing MR Imaging Time by One–sided Reconstruction,* Topical Conference on Fast Magnetic Resonance Imaging Techniques, Case Western Reserve and the American Association of Physicists, Cleveland, Ohio (1987).

(List continued on next page.)

*Primary Examiner*—Andrew W. Johns
*Assistant Examiner*—Shervin Nakhjavan
(74) *Attorney, Agent, or Firm*—Thompson Coburn, LLP

(57) ABSTRACT

A method of complex image reconstruction from partially acquired data in two or more dimensions is presented. This method uses an iterative multidimensional transformation to reconstruct a magnetic resonance image. The method of this invention abandons the theory that complex conjugation is necessary to reconstruct a complex image from partially acquired data and, instead, utilizes a phase constraint to make the solution determinable using a multidimensional transformation technique. This method of image reconstruction allows magnetic resonance images to be reconstructed by acquiring only one-half of the k-space data.

20 Claims, 4 Drawing Sheets

OTHER PUBLICATIONS

J. R. McFall, N. J. Pelc, R. M. Vavrek, *Correction of Spatially Dependent Phase Shifts for Partial Fourier Imaging,* Magnetic Resonance Imaging, vol. 6, 143–55 (1988).

M. R. Smith, S. T. Nichols, R. M. Henkelman, M. L. Wood, *Application of Autoregressive Modeling in Magnetic Resonance Imaging to Remove Noise and Truncation Artifacts,* Magnetic Resonance Imaging, vol. 4, 257–61 (1986).

E. M. Haacke, E. D. Lindskog, and W. Lin, *A Fast, Iterative Partial–Fourier Technique Capable of Local Phase Recovery,* Journal of magnetic Resonance, vol. 92, 126–45 (1991).

J. W. Goldfarb, E. M. Haacke, F. Boada, W. Lin, *Reconstruction of Doubly Asymmetric Data for 2D and 3D Rapid Imaging,* Book of Abstracts, 10th Annual Meeting of the Society of Magnetic Resonance in Medicine, San Francisco, California, 1226 (1991).

R. T. Constable, R. M. Henkelman, *Data Extrapolation for Truncation Artifact Removal,* Magnetic Resonance in Medicine, vol. 17, 108–18 (1991).

S. Amartur, E. M. Haacke, *Modified Iterative Model Based on Data Extrapolation Method to Reduce Gibbs Ringing,* Journal of Magnetic Resonance Imaging, vol. 1, 307–17 (1991).

S. Amartur, Z.–P. Liang, F. Boada, E. M. Haacke, *Phase–constrained Data Extrapolation Method for Reduction of Truncation Artifacts,* Journal of Magnetic Resonance Imaging, vol. 1, 721–24 (1991).

Z.–P. Liang, F. Boada, R. T. Constable, E. M. Haacke, P. C. Lauterbur, M. R. Smith, *Constrained Reconstruction Methods in MR Imaging,* Reviews of Magnetic Resonance in Medicine, vol. 4, 67–185 (1992).

D. C. Noll, D. G. Nishimura, A. Macovski, *Homodyne Detection in Magnetic Resonance Imaging,* IEEE Transactions on Medical Imaging, vol. 10, No. 2, 154–63 (1991).

E. M. Haacke, J. Mitchell, D. Lee, *Improved Contrast at 1.5 Tesla Using Half–Fourier Imaging: Application to Spin–Echo and Angiographic Imaging,* Magnetic Resonance Imaging, vol. 8, 79–90 (1990).

W. Perman, E. Heiberg, V. Herrmann, *Half–Fourier, Three–dimensional Technique for Dynamic Contrast–enhanced MR Imaging of both Breasts and Axillae: Initial Characterization of Breast Lesions,* Radiology, vol. 200, 263–69 (1996).

* cited by examiner

METHOD OF MRI IMAGE RECONSTRUCTION FROM PARTIALLY ACQUIRED DATA IN TWO OR MORE DIMENSIONS USING A MULTIDIMENSIONAL INVERSE TRANSFORM TECHNIQUE

BACKGROUND OF THE INVENTION (1) Field of the Invention

This invention pertains to the field of magnetic resonance imaging and multi-dimensional image reconstruction from partially acquired data. More particularly, this invention pertains to a method of reconstructing a complex MRI image from a portion of asymmetrically acquired data using an iterative multidimensional inverse transform technique. The use of the method reduces data acquisition time by reducing the amount of data needed to reconstruct the image matrix.

(2) Description of the Related Art

Acquiring data in many imaging modalities often takes a significant length of time. Typically, as less Acquiring data in many imaging modalities often takes a significant length of time. Typically, as less of the data are acquired, the resolution of the image is decreased while the temporal resolution is increased. On the other hand, the collection of more data allows for higher resolution but requires longer acquisition times.

The size of the data matrix used to generate an image is known to affect the resolution. In one dimension, if the data matrix coverage comprises data from $-k_{max}$ to $k_{max}$, then the resolution is given by $\Delta x=1/(2k_{max})$. Many methods of reducing image acquisition time are based on the theory that it is not necessary to collect all the data for the data matrix since, theoretically, the data is purely real and will therefore express complex conjugation symmetry. By using complex conjugation symmetry, the negative terms in a data matrix $s(k)$ can be generated from the positive terms since $s(-k)=s^*(k)$. Therefore, if only half of the data of a given data matrix need to be acquired to produce an image that has the same properties in terms of its reconstructed appearance as if all the data were acquired, a factor of two in time can be saved. On the other hand, if resolution rather than time is the issue, then the same number of data points as previously acquired can be used to create a data matrix twice as large as before, thereby increasing the resolution by a factor of two. In practice, however, the data acquired is never purely real due to artifacts and noise which are invariably present. As such, the images produced by imposing complex conjugate symmetry are only approximations of the images that would have been produced by collecting all of the data for the given data matrix.

In the case of magnetic resonance imaging, reconstruction of a given data matrix, or k-space as it is known in the field, from partially collected data has the potential of improving acquisition speed or resolution as described generally above. Prior art methods of data extrapolation, known as partial or fractional k-space coverage techniques, are well known in the field of magnetic resonance imaging and are set forth in detail in Liang et al., *Constrained Reconstruction Methods in MR Imaging*, Reviews of Magnetic Resonance in Medicine, Vol. 4, 67–185 (Pergamon Press Ltd. 1992). These methods have included one dimensional partial Fourier methods and constrained reconstruction techniques as described below. While the former can reduce imaging times by at most a factor of two, the savings in time from the latter methods is less predictable and is often less than a factor of two.

Initial attempts at using partial Fourier imaging utilized methods that simply acquired half of the k-space of a given data matrix and then used complex conjugation to recover the missing half. Typically, for a two-dimensioned image acquisition scheme, such methods involve acquiring data $s(k_x, k_y)$ for the entire top half of k-space as shown in FIG. 1. In FIG. 1, the k-space shown is two-dimensional data where the two dimensions can represent the read and phase encoding directions or the phase and partition encoding directions. Assuming complex conjugate symmetry (i.e., $s(-k_x,-k_y)=s^*(k_x, k_y)$), data for the lower half of k-space can then be approximated. This is performed using a one-dimensional approach by first transforming the acquired data along the horizontal direction to create a set of one-dimensional image/data set $s(x, k_y)$ for each x-position in the image matrix as shown in FIG. 2. With the data so transformed, the one-dimensional data in $k_y$ is then complex conjugated for each x-position to produce the missing half of the image matrix. However, as discussed above, such approaches are based on the assumption that the data are purely real and it is well known that complex conjugation cannot produce the missing half of k-space if the object is complex or when other sources of error are present in the data.

For the above reasons, a method was sought to remove any background variations in the raw data caused by the presence of imaginary information in the image itself. Such an attempt was first made by Margosian as disclosed in *Faster MR Imaging—Imaging with half the Data*, SMRM Conference Abstracts, Vol. 2, 1024–25 (1985). This method is well known in the art and is performed by extending the region of acquired data (usually by 8 points for spin echo data) as shown in FIG. 3 to obtain data for both positive and negative k-space points (i.e., before or after the origin in a given direction for an equal number of points). A low pass estimate of the phase, $\phi(x, y)$, of the image is determined by using only the central portion of the acquired k-space data. Additionally, the acquired data is transformed as described in the above half k-space method after zero filling the remainder of the data matrix and applying an asymmetrical Hamming-like filter to the central portion of the data. This transformation produces a first estimate of the image that is complex, not real. An assumption is then made that the phase ($\phi(x, y)$) errors are small enough that the reconstructed image can be phase corrected by multiplying the first complex estimate of the image by $e^{-i\phi(x, y)}$. The final image is presumed to be the real part of this second estimate. There are several disadvantages of using this approach. First, if the phase has any high spatial frequency components in it, the method will fail because too few points are used to estimate the phase. Increasing the number of points used would require collecting additional data, thereby reducing the time benefits of the method. Second, the filter used suppresses low spatial frequency information in the image itself, leading to an unnecessary loss in signal-to-noise over and above that inherent in the partial Fourier method itself. Finally, using solely the real part of the image matrix is not representative of the pristine image. Attempted methods of improving the phase estimate have not obviated these difficulties (SR McFall et al., *Corrections of Spatially Dependant Phase Shifts for Partial Fourier Imaging*, Magnetic Resonance Imaging, Vol. 6, 143–55 (1988)).

A similar approach using an iterative scheme which attempts to force the image to be real was developed by Cuppen et al. as disclosed in U.S. Pat. No. 4,853,635, the disclosure of which is incorporated herein by reference. Extensions to this approach have also been developed by Haacke et al. as disclosed in *A Fast, Iterative, Partial-Fourier Technique Capable of Local Phase Recovery*, Journal of Magnetic Resonance, Vol. 92, 126–45 (1991) which is incorporated herein by reference.

In general, the Cuppen approach has the advantage over the Margosian method in its ability to handle phase errors and to do so without an increased reduction of the signal-to-noise ratio above the sqrt(2) expected reduction. In Cuppen's method, a similar one-dimensional approach is used to generate a complex image $\rho(x)$. A new complex image, $\rho_1(x)$, is then calculated as $\rho_1(x)=\rho^*(x)e^{i2\phi x}$. Estimated data for the k-space is then calculated by transforming $\rho_1(x)$, thereby generating $s_1(k_x)$. The estimated data, $s_1(k_x)$, is then used in place of the uncollected data and is merged with the acquired data $s(k_x)$ to generate $s_{1new}(k_x)$ which can then be transformed to generate a new complex image $\rho_2(x)$, where $\rho_2(x)=F^{-1}(s_{1new}(k_x))^*e^{i2\phi x}$ (where $F^{-1}$ represents the inverse Fourier transform operation). The above mentioned steps can then be iterated until a desired convergence has been obtained. This method, like other prior art methods, has several disadvantages. First, it has the potential to generate the correct or exact image, as opposed to an approximate image, only when the image is in fact real.

Second, as more points are added to improve the phase information, more than half of the k-space data must first be acquired, making the method not truly a half-Fourier method and reducing the expected savings in data acquisition time and effort.

Other methods also exist to try and extrapolate missing data using parametric estimation techniques as disclosed in Z. -P. Liang et al., *Phase-constrained Data Extrapolation Method for Reduction of Truncation Artifacts*, JMRI, Vol. 1, 721–24, (1991). Several attempts in this direction utilize models to change the basis functions of the data representation so that an entirely different reconstruction algorithm is used without involving Fourier transforms at all. These methods have many difficulties and are not in widespread use. One disadvantage is that the data reconstruction time for the methods are very long compared to the more common Fourier methods (often hundreds of times longer). Additionally, these methods are very sensitive to the shape of the structures being imaged and often produce very poor estimates of the image.

All Fourier methods of image reconstruction in the prior art, both single step methods (Margosian, McFall et al., etc.) and iterative methods (Cuppen, Haacke), are based on the above described one dimensional implementation and complex conjugation assumptions. As described above, to produce an acceptable image using these methods requires extending the acquired data near the central part of k-space to include at least a portion of symmetrically acquired data. This combined with the fact that complex conjugation only reflects data through the origin means that parts of k-space will have no estimates for their data points unless more than half the data points are originally acquired. Thus, these methods fail to reduce acquisition time by a factor of two as is desired. However, such methods have been utilized in the prior art for over 15 years and it has long been accepted that complex conjugation is required to solve the problem.

SUMMARY OF THE INVENTION

Contrary to the long felt belief that complex conjugation is required to reconstruct a partially acquired multidimensional data matrix, the method of this invention, although it can be used in conjunction with complex conjugation methods, utilizes an iterative multidimensional reconstruction technique that eliminates the need and disadvantages associated with using a complex conjugation method. Furthermore, the available data used to constrain the reconstruction increases as the number of dimensions increases while still maintaining the same time savings of a factor of two. This provides a significant improvement in image quality over prior art methods.

Generally, the method of this invention comprises calculating a magnitude component ($\rho^{m1}(x, y)$) of the image matrix by transforming the data matrix $s(k_x,k_y)$ using a multidimensional reconstruction technique such as a multi-dimensional inverse Fourier transform. This magnitude component can then be merged with a phase component ($\phi_e(x, y)$) of the image matrix, which like the magnitude component is calculated by transforming the data matrix using a multidimensional reconstruction technique, but with the data matrix filled with less than all the collected data or with image data information from a second sampling. By merging the magnitude and phase components from two separate transformations, an image matrix $\rho_1(x, y)=\rho_{m1}(x, y)e^{i\phi_e(x, y)}$ is created which can then generate estimated values for the data matrix $s_1(k_x,k_y)$ by transforming the image matrix back into the data matrix domain using a multidimensional reconstruction technique such as a multidimensional forward Fourier transform. With the data matrix filled with the collected data in its original form and with estimated data values filling the uncollected portion of the data matrix, a new magnitude component $\rho_{m2}(x, y)$ can be calculated by again transforming the data matrix $s_1(k_x,k_y)$ using a multidimensional reconstruction technique. Thus, an iterative process results using the phase component as a constraint whereby the new magnitude component is combined with the original phase component to form a new image matrix $\rho_2(x, y)=\rho_{m2}(x, y)e^{i\phi_e(x, y)}$ which, if necessary, can be used to generate new estimated data values yet again, and so forth until convergence is reached.

In principle, this method is complementary to the usual partial Fourier imaging and, in fact, can be used in place of it to generate unacquired data and save a factor of two or more in acquisition time. As in parametric methods, the invention need only acquire as many data points as there are unknowns. Using the method of this invention, no complex conjugation is needed and the data collected can be designed to save exactly a factor of two in time, while still obtaining a much larger coverage of the central part of k-space than previous methods to ensure that the phase data is very accurately determined. Furthermore, the method does not require many of the assumptions necessary with previous one-dimensional methods and, as such, it is a more robust method than those previously used.

DETAILED DESCRIPTION OF THE INVENTION

The method of this invention discards the philosophy that complex conjugation is a prerequisite to obtaining a good image and solves the problem instead as one where the reconstruction of a data matrix from partial acquired data is an underdetermined problem (since there are more unknowns than the number of data points). The application of an appropriate phase constraint can add a sufficient number of constraints to make the problem solvable (determinable).

Figure 1:
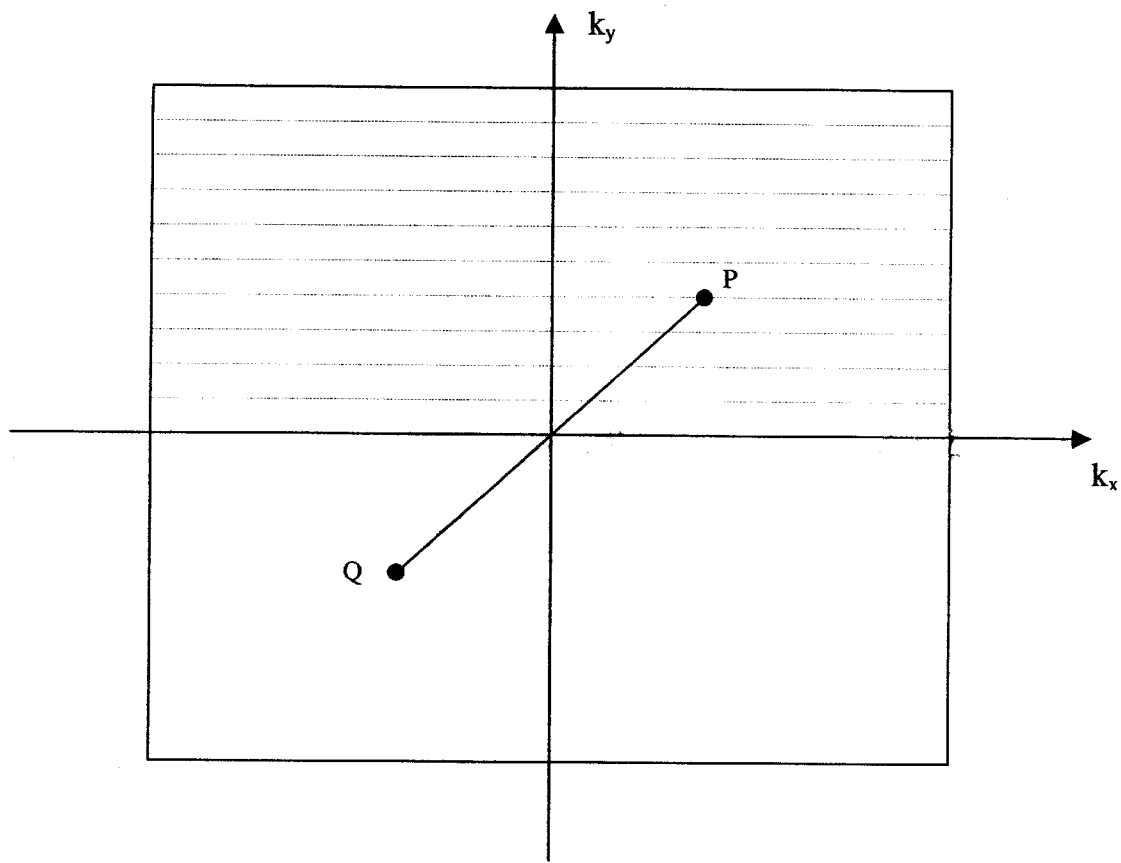
FIG. 1 is a k-space diagram representing the data in the upper half of the $k_x$–$k_y$ plane that is acquired by the prior art method of image reconstruction wherein complex conjugate symmetry is used to take any point P and reflect it through the origin to the point Q.
Figure 2:
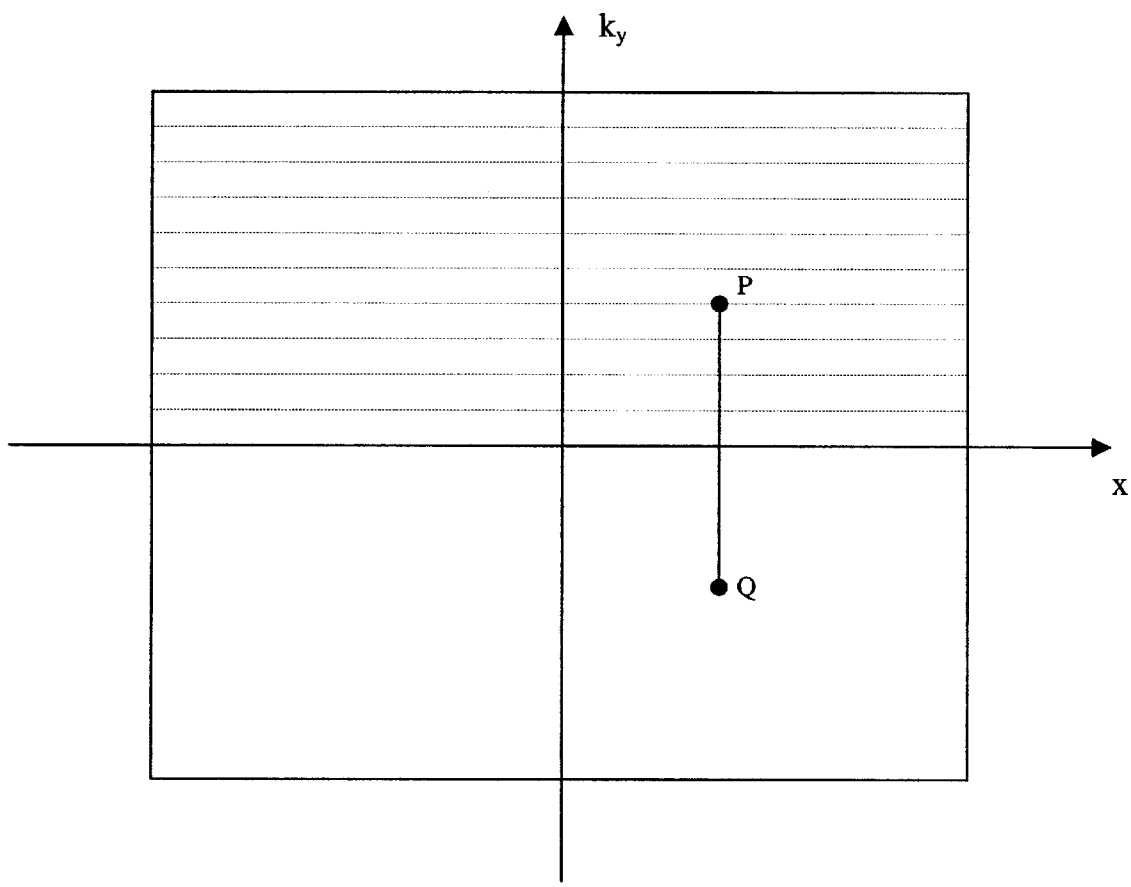
FIG. 2 represents a step in the prior art complex conjugate method after the k-space data has first been one-dimensionally Fourier transformed along $k_x$ to generate a series of one dimensional asymmetric data sets in $k_y$ such that complex conjugation can cover the lower part of k-space by vertically reflecting point P to point Q and after which a Fourier transformation can then be applied to each set of one-dimensional data in $k_y$.
Figure 3:
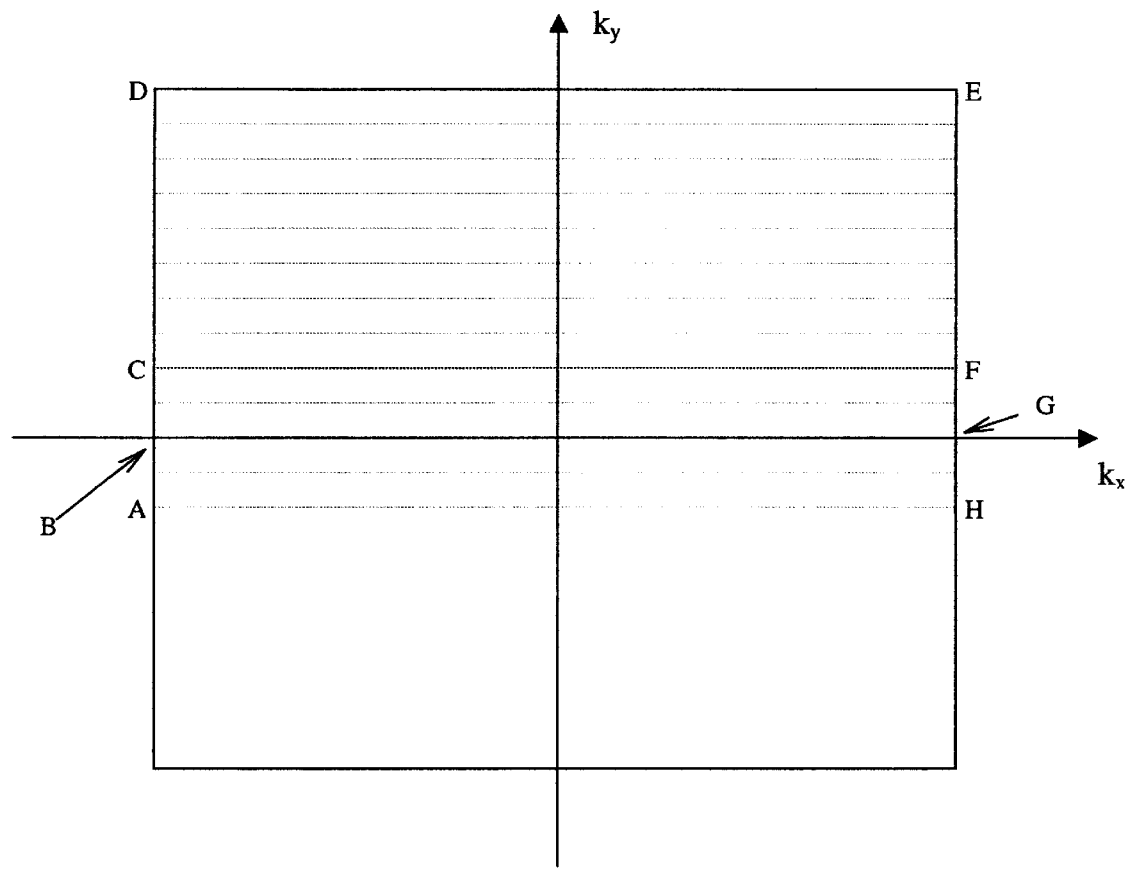
FIG. 3 is a k-space diagram showing the extra central part of negative $k_y$-space (shown encompassed by the region ABGH) that is acquired by some prior art image reconstruction methods to obtain a symmetric low spatial frequency coverage of $k_y$-space (shown encompassed by the region ACFH) such that an estimate of the low spatial frequency phase image can be calculated.
Figure 4:
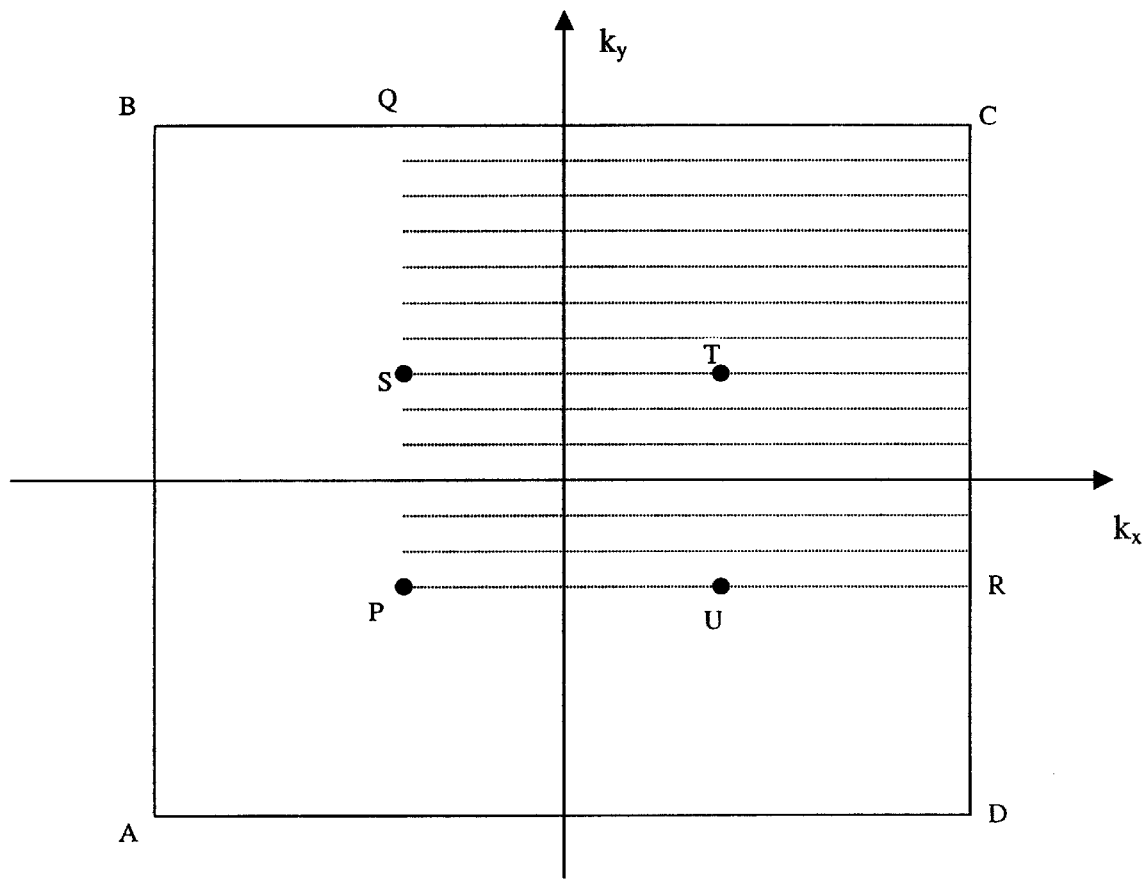
FIG. 4 represents k-space coverage of the preferred embodiment of the invention wherein the area bounded by the points PQCR represents k-space coverage of the data acquisition and the area bounded by the points PSTU represents the central k-space region used to estimate the low spatial frequency phase image.

The preferred embodiment of a method in accordance with this invention is herein described as used to reconstruct a magnetic resonance image matrix from fractional k-space coverage in two dimensions. FIG. 4 represents a two dimensional data matrix of k-space bounded by the points A, B, C, and D such that the data matrix is equal in size to the desired image matrix to be obtained. As done in the prior art, a fraction of data values to fill a portion of the data matrix are acquired by sampling a signal from the magnetic resonance scan.

Although the sampled data could fill any portion of the data matrix, contiguous or not, the portion of the data matrix for which sampled values have been acquired $s(k_x,k_y)$ is represented in FIG. 4 as a contiguous portion bounded by points P, Q, C, and R. Additionally, the preferred embodiment acquires data preferably to fill the entire first quadrant of the data matrix and portions of the remaining quadrants so as to comprise one-half of the data points of the data matrix as shown.

From the acquired sampled data values, a magnitude and phase component for the image matrix are calculated using a two-dimensional Fourier transformation. The magnitude component of the image matrix, $\rho_m(x, y)$, is calculated by transforming the matrix with the portion of the data matrix bounded by P, Q, C, and R assigned the sampled values and the remaining data assigned values of zero. The phase component, $\phi_e(x, y)$, is calculated from only a subset of the sampled data and, since the preferred embodiment applies to magnetic resonance imaging in which the low spatial frequencies are of greatest concern, the sampled data from the central most portion of k-space is preferably selected as the region shown bounded by P, S, T, and U that extends symmetrically about the origin of the matrix. With the data matrix filled with the subset of the sampled data and the remainder of the data in the data matrix assigned values of zero, an interpolation filter, such as preferably a Hanning filter, is applied to the data nearest the bounds of the subset to avoid sharp jumps along the boundaries and the phase component of the image matrix is then calculated from the two-dimensional Fourier transformation of the data matrix.

The magnitude and the phase component, combined together, represent an estimated image matrix, $\rho_1(x, y)=\rho_m(x, y)e^{i\phi e(x, y)}$. The preferred embodiment utilizes an iterative procedure to arrive at not only a potentially unique image but also, in the case of noiseless data, the correct image since only half the data supplies the necessary constraint to make the problem determinable. The iterative procedure involves the step of calculating estimated data values $s_1(k_x, k_y)$ for the data matrix using the two-dimensional Fourier transformation of the estimated image matrix, $\rho_1(x, y)$. A new magnitude component of the image matrix, $\rho_{mnew}(x, y)$ is then calculated preferably by transforming the data matrix $s_{1new}(k_x,k_y)$ with the portion of the data matrix bounded by P, Q, C, and R assigned the original sampled values $s(k_x,k_y)$ and the remaining portion assigned the estimated values $s_1(k_x, k_y)$, the estimated values replacing the values of zero originally used. Prior to calculating the new magnitude component and as part of the transformation technique, an interpolation filter, which in the preferred embodiment is a Hanning filter, can be applied to neighboring boundary points to avoid sharp jumps between the sampled data values and the estimated values. The new magnitude component, like the magnitude component before, is then combined with preferably the original phase component determined above to create a second estimated image matrix, $\rho_2(x, y)=\rho_{mnew}(x, y)e^{i\phi e(x, y)}$. By repeating the iterative procedure above, additional estimated image matrixes can be calculated until a desired convergence has been reached between the most recently calculated magnitude component and previous iteration thereof. Using the preferred embodiment as described above, it has been found that convergence can be obtained by performing the iterative steps to produce a second or third image matrix for human scans or a fourth or fifth image matrix for phantom object scans.

While the method of this invention has been described in reference to a particular preferred embodiment, the invention is not limited to the specific steps of the preferred embodiment. The invention can easily be practiced using numerous alternatives from the above described description.

For example, although one-half of the data is acquired using the method of the preferred embodiment, it is possible that even less is needed if merely an approximation of the image is desired. Another alternative can utilize initial values other than zero to fill the unacquired portion of the data matrix when calculating the phase component of the image matrix or when making the first magnitude calculation. Such other initial values for $\phi_e(x, y)$ could be from data acquired from a second signal, a prescan for example, or obtained from any other method known in the art. Likewise, $\phi_e(x, y)$ could be iterated by some manner, for instance, by using a greater portion of the acquired data than originally used to calculate a new phase component. In yet other alternatives, various filters known in the art can be applied at any given step to reduce the number of iterations required to be performed or to improve the image when only an approximation of the image is desired.

It is important to note that the method could also be combined with other methods known in the art. For example, a prior art reconstruction method could be performed on the acquired data to generate nonzero initial values for the unacquired portion of the data matrix or could be used after any number of iterations have been performed in accordance with the invention.

In theory, how well the method works depends on how close the estimated phase is to the true phase. For an N×N complex data set, the phase adds at most $N^2$ constraints. This means that $N^2/2$ k-space points are required to produce the correct solution. In theory, it doesn't matter which part of k-space is covered as long as the data set covers half of k-space.

Furthermore, the invention is not limited to use with a two-dimensional data matrix and similar steps can be used for higher order multidimensional data. It can be observed that in the one-dimensional case, no points can be collected before the echo if a factor of two in time is to be saved and, hence, no good phase correction is possible without spending more time to collect the data. However, in two-dimensional applications, the number of points collected past the echo is 41.4% of the usual number collected after the echo (100(sqrt(2)−1)) and in three-dimensions this increases to 58.7% (100($2^{2/3}$−1)). As the fractional coverage of the central k-space increases, the reconstructed result improves because of the improved constraint information while the savings in time is still a factor of two.

The ability to reconstruct an image from partially acquired data using the method of this invention opens the door to a myriad of new design possibilities in collecting complex data in any field that utilizes image reconstruction, be it magnetic resonance imaging, computed tomography, or spectroscopic data acquisition. The method can be used to reduce imaging time by a factor of at least two in all such applications. For example, chemical shift imaging uses phase encoding gradients in all directions to spatially encode the data and could potentially benefit from the multidimensional fractional k-space coverage algorithm described herein. It should be noted that not all applications of the method would necessarily utilize a Fourier based multidimensional transformation method and other multidimensional transformation methods based on, for example, Laplace transforms, Radon transforms, and various other parametric transforms could be used as well.

Additionally, the method can be used as a means of reducing the data space required to digitally store or transfer an image having complex information. Regardless of which method was used to produce an image, the image can be transformed back into the data matrix domain. Since only one-half of this data is needed to reconstruct the image using the invention, one-half of the data may be discarded and only the remaining half saved or transferred. When desired, the saved half of the data can be used to regenerate the image using this method.

As mentioned above, the preferred embodiment of the invention involved acquiring as much of the central portion of k-space as possible. However, for other applications, data points acquired outside of the central portion of k-space can be varied to include more or less of the center and more or less of the edges of k-space. This may prove valuable when high edge definition rather than the low spatial frequencies is of interest.

Although there is usually a sqrt(2) signal loss associated with partial Fourier imaging, it has been found that this is not always the case. Due to the fact that the central data phase estimate (being of inherently lower resolution) can serve as an excellent representation of the actual phase with a reduced noise component, the loss in signal-to-noise ratio may, sometimes, be less than sqrt(2).

The structure of the object being imaged is also likely to determine just how much of k-space is required to correctly reconstruct the pristine image. A detailed image will require the full half k-space coverage. However, it may be that less than half the data can be used to reconstruct images with less detail. This would allow for further improvements in time. To validate whether this is the case or not, a given type of image would need to be tested to ensure that its reconstruction characteristics were of sufficient quality to warrant the application of this approach using less than half the data.

While the present invention has been described by reference to specific embodiments, it should be understood that modifications and variations of the invention may be performed without departing from the scope of the invention defined in the following claims.

What is claimed:

1. A method of reconstructing a complex multidimensional image matrix having magnitude and phase information, the method comprising:

acquiring sampled data values to fill a first portion of data points in a data matrix, all other portions of the data matrix constituting a second portion of data points in the data matrix, the sampled data values coming from a first signal having magnitude and phase information;

calculating a magnitude component for each data point within an image matrix by transforming the data matrix using an inverse multidimensional transformation method, the calculation being made with the first portion of data points having the sampled data values assigned thereto and the second portion of data points having initial values assigned thereto; and calculating a phase component for each data point within the image matrix by transforming the data matrix using an inverse multidimensional transformation method, the calculation being made with at least one data point of the data matrix having a value assigned thereto that is different from the value assigned to the at least one data point when calculating the magnitude component.

2. The method of claim 1, further comprising:

calculating estimated values for all data points of the data matrix by transforming the image matrix using a forward multidimensional transformation method, the calculation being made with each data point of the image matrix assigned a combination of the magnitude component and the phase component thereto; and calculating a new magnitude component for each data point within the image matrix by transforming the data matrix using an inverse multidimensional transformation method, the calculation being made with the first portion of data points having the sampled data values assigned thereto and the second portion of data points having the estimated values assigned thereto.

3. The method of claim 2, further comprising:

recalculating the estimated values for all data points of the data matrix by transforming the image matrix using a forward multidimensional transformation method, the calculation of the estimated values being made with each data point of the image matrix assigned a function of the new magnitude; and then recalculating the new magnitude component for each data point within the image matrix by transforming the data matrix using an inverse multidimensional transformation method, the calculation being made with the first portion of data points having the sampled data values assigned thereto and the second portion of data points having the estimated values assigned thereto.

4. The method of claim 3, further comprising:

repeating the steps of, first, recalculating the estimated values and, second, recalculating the new magnitude component at least one time until a desired convergence has been obtained.

5. The method of claim 3, wherein:

the function of the new magnitude component assigned to the image matrix when recalculating estimated values is also a function of the phase component.

6. The method of claim 1, wherein:

the initial values assigned to the second portion of the data matrix are zeroes and the phase component is calculated with less than all the data points of the first portion of data points assigned the sampled data values thereto and all other data points in the data matrix assigned values of zero.

7. The method of claim 6, wherein:

the less than all data points of the first portion of data points used to calculate the phase are data points centrally located within the data matrix.

8. The method of claim 1, wherein:

the initial values are zeroes and the phase component is calculated with a plurality of data points in the data matrix assigned values obtained from a second sampled signal and any remaining data points in the data matrix are assigned values of zero.

9. The method of claim 8, wherein:

all of the data points in the data matrix are assigned values acquired from the second sampled signal when calculating the phase component, thereby leaving no remaining data points having values of zero assigned thereto.

10. The method of claim 1, wherein:

the magnitude component for each data point within the image matrix is calculated with at least one data point of the second portion of the data matrix assigned a value obtained from complex conjugation of the sampled data values.

11. The method of claim 1, wherein:

at least one of the multidimensional transformation methods used involves a filtering operation.

12. The method of claim 1, wherein:

the data matrix is multi-dimensional k-space for a nuclear magnetic resonance imaging scan and the first signal has magnitude and phase information of the nuclear magnetic resonance imaging scan.

13. The method of claim 12, wherein:

a multidimensional Fourier Transform is used as at least one of the multidimensional transformation methods.

14. The method of claim 13, wherein:

at least one of t he methods of multidimensional transformation involves a filtering operation.

15. The method of claim 1, wherein:

the number of data points in the first portion of the data matrix is half the number of all data points in the data matrix.

16. The method of claim 1, wherein:

the number of data points in the first portion of the data matrix is less than half the number of all data points in the data matrix.

17. The method of claim 1, wherein:

the data points in the first portion of the data matrix are contiguous.

18. A method of reconstructing a magnetic resonance image from partially acquired k-space data, the method comprising:

collecting data values for a portion of a k-space matrix;

applying a multidimensional Fourier transformation technique to the k-space matrix using all of the collected data values to obtain a first complex image matrix, the first image matrix having magnitude and phase information;

applying a multidimensional Fourier transformation technique to the k-space matrix using a portion of the collected data values to obtain a second complex image matrix, the second image matrix having magnitude and phase information;

generating a first estimated image matrix by combining the magnitude information of the first complex image matrix with the phase information of the second image matrix;

applying a multidimensional Fourier transformation technique to the first estimated image matrix to obtain estimated data values for the k-space matrix;

applying a multidimensional Fourier transformation technique to the k-space matrix using all of the collected data values and a portion of the estimated data values to obtain a third complex image matrix, the third image matrix having magnitude and phase information; and generating a second estimated image matrix by combining the magnitude information of the third complex image matrix with the phase information of the second image matrix.

19. A computer program for reconstructing a magnetic resonance image from partially acquired k-space data using a computer, the computer program comprising:

a retrieval routine for acquiring collected data values for a portion of a k-space matrix;

a process routine for applying a multidimensional Fourier transformation technique to the k-space matrix using all of the collected data values to obtain a first complex image matrix, the first image matrix having magnitude and phase information;

a process routine for applying a multidimensional Fourier transformation technique to the k-space matrix using a portion of the collected data values to obtain a second complex image matrix, the second image matrix having magnitude and phase information;

a process routine for generating a first estimated image matrix by combining the magnitude information of the first complex image matrix with the phase information of the second image matrix;

a process routine for applying a multidimensional Fourier transformation technique to the first estimated image matrix to obtain estimated data values for the k-space matrix; and a process routine for applying a multidimensional Fourier transformation technique to the k-space matrix using all of the collected data values and a portion of the estimated data values to obtain a third complex image matrix, the third image matrix having magnitude and phase information.

20. The computer program of claim 19, further comprising:

a process routine for filtering the k-space matrix.

* * * * *